(12) United States Patent
Zhang et al.

(10) Patent No.: US 11,948,736 B2
(45) Date of Patent: Apr. 2, 2024

(54) SUPERCONDUCTING MAGNET SYSTEMS AND METHODS FOR MAKING SUPERCONDUCTING MAGNET SYSTEMS HAVING TWO-STAGE QUENCHING

(71) Applicant: GE Precision Healthcare LLC, Wauwatosa, WI (US)

(72) Inventors: Zhenyu Zhang, Florence, SC (US); Stuart Paul Feltham, Florence, SC (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 255 days.

(21) Appl. No.: 17/714,669

(22) Filed: Apr. 6, 2022

(65) Prior Publication Data
US 2023/0326641 A1    Oct. 12, 2023

(51) Int. Cl.
*H01F 6/06*    (2006.01)
*H01F 6/02*    (2006.01)
*H01F 27/28*    (2006.01)

(52) U.S. Cl.
CPC ............... *H01F 6/06* (2013.01); *H01F 6/02* (2013.01); *H01F 27/2885* (2013.01)

(58) Field of Classification Search
None
See application file for complete search history.

(56) References Cited

U.S. PATENT DOCUMENTS

| | | | |
|---|---|---|---|
| 7,701,677 B2 | 4/2010 | Schultz et al. | |
| 8,415,952 B2 | 4/2013 | Lvovsky | |
| 8,903,465 B2 | 12/2014 | Huang et al. | |
| 9,201,128 B2 | 12/2015 | Bonanni et al. | |
| 9,305,703 B2 | 4/2016 | Bonanni et al. | |
| 9,463,948 B2 | 10/2016 | Bonanni et al. | |
| 10,156,620 B2 | 12/2018 | Havens et al. | |
| 2011/0148416 A1* | 6/2011 | Jiang | G01R 33/3802 324/318 |
| 2012/0098538 A1* | 4/2012 | Shen | G01R 33/3873 324/318 |
| 2023/0137679 A1* | 5/2023 | Song | H01F 6/02 361/19 |

FOREIGN PATENT DOCUMENTS

WO    WO-2011122403 A1 * 10/2011    ......... G01R 33/3815

\* cited by examiner

*Primary Examiner* — Mohamad A Musleh
(74) *Attorney, Agent, or Firm* — Andrus Intellectual Property Law, LLP

(57) ABSTRACT

A superconducting magnet system having two-stage quenching. A primary coil assembly includes a coil section configured to be superconducting when conducting current below a first critical current. An EMI shielding coil assembly includes a coil section configured to be superconducting when conducting current below a second critical current, which is electrically coupled to a variable resistor configured to be superconducting when conducting current below a third critical current and to be non-superconducting when conducting current at or above the third critical current that is less than both the first and second critical currents. Generating a magnetic flux within the EMI shielding coil assembly causes the current conducted through the variable resistor to exceed the third critical current, quenching the variable resistor and generating heat. The EMI shielding coil assembly is disposed such that the heat from the variable resistor quenches the primary coil assembly.

20 Claims, 9 Drawing Sheets

SUPERCONDUCTING MAGNET SYSTEMS AND METHODS FOR MAKING SUPERCONDUCTING MAGNET SYSTEMS HAVING TWO-STAGE QUENCHING

FIELD

The present disclosure generally relates to superconducting magnet systems and methods for making superconducting magnet systems, and more particularly for superconducting magnet systems and methods for making superconducting magnet systems for use in magnetic resonance imaging systems.

BACKGROUND

Modern magnetic resonance imaging (MRI) systems incorporate multiple superconducting magnet coils that serve different functions. In general, the coils are formed by winding conductive wire in winding patterns corresponding to the magnetic field pattern desired to be provided when current flows therethrough. The conductive wire is often wound around a support structure, also referred to as a coil form, for rigidity and ease of manufacturing as a subcomponent of the overall magnetic resonance imaging system. Epoxy resin materials may also or alternatively be used to provide rigidity and maintain the winding pattern.

One set of superconducting coils, collectively referred to as the primary coil assembly or the primary magnet, provides a static, stable, and spatially uniform magnetic field (also referred to as a B0 field). Another set of superconducting coils, collectively referred to as a B0 coil assembly or an electromagnetic interference (EMI) shielding coil assembly, protects the B0 field from low frequency EMI, which for example may be introduced by machinery or vehicles near the MRI system. Additional sets of coils may be provided for other functions, such as shim coils (active and/or passive) that generate specific field harmonics to ensure field uniformity within the B0 field, as well as bucking coils to provide stray field control.

An MRI system further includes a refrigeration system containing helium under vacuum. The refrigeration system is configured to keep the primary magnet and the B0 coil assembly extremely cold, near absolute zero, so as to reduce the resistance to conducting electricity therethrough to essentially zero. The primary magnet and the B0 coil assembly are configured such that when extremely cold, the resistance for conducting current therethrough becomes essentially zero. With only minimal resistance, the primary magnet and the B0 coil assembly are superconducting at these extremely low temperatures, resulting in high currents that in turn generate very strong magnetic fields (B0 fields). In the case of a modern primary magnet, this magnetic field may be on the order of 1.5 T, 3.0 T, or higher.

It will be recognized that providing a stronger B0 field enables the MRI system to provide higher image quality for the object being imaged, such as a human or animal patient. However, the increased magnetic strength also increases the risk of injury to the patient and/or damage to the MRI system or other nearby components if magnetic objects are inadvertently left near the MRI system during use. For safety purposes, modern MRI systems are configured such that the strong B0 field produced by the primary magnet can be quickly removed when necessary, for example in an emergency situation. In particular, the B0 field produced by the primary magnet is eliminated or removed in a process known as "quenching" the primary coil assembly. In short, the primary magnet is quenched by making the coils therein non-superconducting. When the coils within the primary magnet are no longer superconducting, the resistance therethrough increases rapidly, resulting in a rapid decrease in the flow of current and likewise a rapid decrease in the magnetic field produced by the primary magnet.

There are two commonly known methods for quenching the MRI system, particularly the primary coil assembly or the primary magnet producing the magnetic field. First, the MRI system may be equipped with an internal heater that is positioned near at a portion of the primary magnet. The internal heater is connectable to an external device for providing the power to the internal heater, causing the internal heater to produce heat. The external device may also be referred to as a magnet rundown unit (MRU), which includes an internal battery for powering the internal heater inside the MRI system. The heat from the internal heater is sufficient to overcome the system previous maintaining the primary magnet at the extremely low temperatures discussed above, thereby increasing the temperature within the primary coil assembly. This in turn quenches the primary coil assembly (i.e., causes the primary magnet to become non-superconducting), thereby causing the magnetic field to quickly decline such that the emergency situation can be resolved.

A second method for quenching the primary coil assembly is to eliminate the vacuum in the refrigeration system that maintains the extremely low temperature required for the primary magnet and the B0 coil assembly to be superconducting. The primary coil assembly is typically cooled with liquid helium, which as discussed above is kept under vacuum within the MRI system. A vacuum port is provided on the exterior of the MRI system, which provides an access point to the vacuum vessel (also referred to as a cryostat vessel) within the refrigeration system. The vacuum port includes a portion designed to be penetrated by a sharp object to break the vacuum seal. In this manner, an operator may use a sharp puncture device to destroy the vacuum seal, eliminating the necessary cooling for superconducting and quenching the MRI system.

SUMMARY

This Summary is provided to introduce a selection of concepts that are further described below in the Detailed Description. This Summary is not intended to identify key or essential features of the claimed subject matter, nor is it intended to be used as an aid in limiting the scope of the claimed subject matter.

One embodiment of the present disclosure generally relates to a superconducting magnet system having two-stage quenching. The superconducting magnet system includes a primary coil assembly having a coil section configured to be superconducting when conducting current below a first critical current, and an EMI shielding coil assembly having one or more coil sections electrically coupled to a variable resistor. The one or more coil sections are configured to be superconducting when conducting current below a second critical current. The variable resistor is configured to be superconducting when conducting current below a third critical current and to be non-superconducting when conducting current at or above the third critical current, where the third critical current is less than both the first critical current and the second critical current. The EMI shielding coil assembly is configured such that generating a magnetic flux within the EMI shielding coil assembly causes the current conducted through the variable resistor to exceed the third critical current, quenching the variable resistor and generating heat. The EMI shielding coil assembly is disposed such that the heat from the variable resistor assembly quenches the primary coil assembly.

In another aspect according to the present disclosure, the variable resistor physically contacts the primary coil assembly.

In another aspect according to the present disclosure, the variable resistor is at least partially coiled with the coil section of the primary coil assembly.

In another aspect according to the present disclosure, the system is configured such that positioning a ferrous object with a magnetic moment in proximity to the EMI shielding coil assembly generates the magnetic flux within the EMI shielding coil assembly. In further aspects, the ferrous object is one of a metallic cylinder and a metallic rod having a mass between 2.5 kg and 20 kg. In further aspects, the system is configured such that the magnetic moment is generated by moving the ferrous object towards the system along a central axis of the primary coil assembly. In further aspects, the system is configured such that the magnetic moment is generated absent physical contact between the ferrous object and the EMI shielding coil assembly.

Another aspect according to the present disclosure includes a ferrous object configured such that positioning the ferrous object in proximity to the EMI shielding coil assembly generates the magnetic flux within the EMI shielding coil assembly.

In another aspect according to the present disclosure, the variable resistor is configured such that the third critical current is between 2.5 and 20 Amps.

In another aspect according to the present disclosure, the variable resistor is a portion of a conductor within the EMI shielding coil assembly that has been treated such that the portion is superconducting subject to the third critical current and a remainder of the conductor is superconducting subject to the second critical current. In further aspects, the conductor forms at least one of the one or more coil sections.

Another embodiment relates to a method for making a superconducting magnet system having two-stage quenching. The method includes providing a primary coil assembly having a coil section configured to be superconducting when conducting current below a first critical current, and providing an EMI shielding coil assembly having one or more coil sections configured to be superconducting when conducting current below a second critical current. The method further includes electrically coupling a variable resistor to the EMI shielding coil assembly, where the variable resistor is configured to be superconducting when conducting current below a third critical current and to be non-superconducting when conducting current at or above the third critical current, and where the third critical current is less than both the first critical current and the second critical current. The method further includes configuring the variable resistor such that generating a magnetic flux within the EMI shielding coil assembly causes the current conducted through the variable resistor to exceed the third critical current, quenching the variable resistor and generating heat. The method further includes disposing the EMI shielding coil assembly such that the heat from the variable resistor quenches the primary coil assembly.

Another aspect according to the present disclosure further includes disposing the variable resistor so as to physically contact the primary coil assembly.

Another aspect according to the present disclosure further includes coiling at least part of the variable resistor with the coil section of the primary coil assembly.

Another aspect according to the present disclosure further includes configuring the EMI shielding coil assembly such that positioning a ferrous object with a magnetic moment in proximity to the EMI shielding coil assembly generates the magnetic flux within the EMI shielding coil assembly.

Another aspect according to the present disclosure further includes configuring the system such that the primary coil assembly is quenched when an external device is positioned in proximity to the EMI shielding coil assembly absent physical contact therebetween.

Another aspect according to the present disclosure further includes configuring the system such the primary coil assembly is quenched when an external device is positioned in proximity to the EMI shielding coil assembly absent a power supply powering the external device.

Another aspect according to the present disclosure further includes configuring the EMI shielding coil assembly such that generating a magnetic field, via an external coil, generates the magnetic flux within the EMI shielding coil assembly.

Another aspect according to the present disclosure further includes configuring the system such that the magnetic moment is generated by moving the ferrous object towards the system along a central axis of the primary coil assembly.

Another embodiment relates to a superconducting magnet system having two-stage quenching. The superconducting magnet system includes a primary coil assembly having a coil section configured to be superconducting when conducting current below a first critical current, and an EMI shielding coil assembly having one or more coil sections configured to be superconducting when conducting current below a second critical current. A variable resistor is electrically coupled to the EMI shielding coil assembly and thermally coupled to the primary coil assembly, the variable resistor being configured to be superconducting when conducting current below a third critical current and to be non-superconducting when conducting current at or above the third critical current that is less than both the first critical current and the second critical current. An external device is configured to generate a magnetic flux within the EMI shielding coil assembly when positioned in proximity thereto, where generating the magnetic flux within the EMI shielding coil assembly causes the current conducted through the variable resistor to exceed the third critical current, quenching the EMI shielding coil assembly and generating heat. The EMI shielding coil assembly is disposed such that the heat generated within the EMI shielding coil assembly quenches the primary coil assembly.

Various other features, objects and advantages of the disclosure will be made apparent from the following description taken together with the drawings.

BRIEF DESCRIPTION OF THE DRAWINGS

The present disclosure is described with reference to the following drawings.

DETAILED DISCLOSURE

The present disclosure generally relates to superconducting magnet systems and methods for making superconducting magnet systems for use in magnetic resonance imaging (MRI) systems. As will be discussed further below, these magnet systems may be integrated within MRI systems otherwise similar to those presently known in the art, for example the 3.0 T SIGNA™ MR produced by GE Healthcare®.

Figure 1:
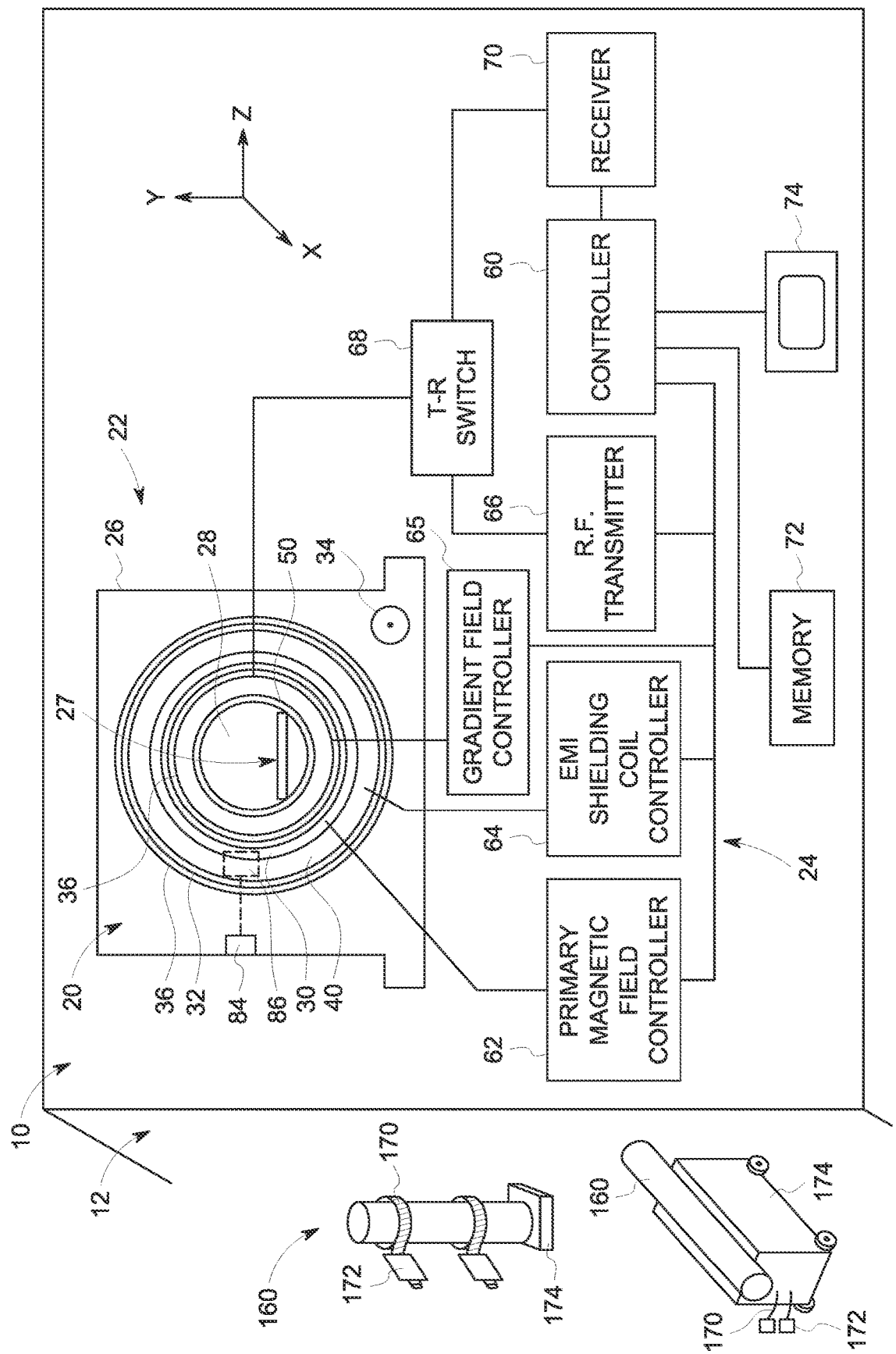
FIG. 1 is schematic view of a magnetic resonance imaging (MRI) system incorporating a magnet system configured to be quenched according to the present disclosure.

FIG. 1 shows a portion of one embodiment of a magnet system 20 according to the present disclosure, which is shown integrated into an MRI system 10. The MRI system 10 includes an imaging portion 22 and a processing portion 24 configured for processing the data received from the imaging portion 22 in a manner presently known in the art. The imaging portion 22 of the MRI system 10 is generally supported by a gantry 26. The components of the imaging portion 22 are supported by the gantry 26 so as to generally surround a bore 28 of the MRI system 10. The bore 28 is configured such that an object may be positioned therein during use for imaging (e.g., a human patient laying on a patient table 27 within the bore 28).

One of the components of the imaging portion 22 that is supported by the gantry 26 is a primary coil assembly 30, which as discussed above is part of the primary magnet within the magnet system 20. The primary coil assembly 30 has one or more coiled sections of a conductive material (e.g., a metallic wire) that is wrapped around a support structure, shown as the coil form 31 in a manner known in the art. Each of the one or more coils sections in the primary coil assembly 30, and particularly the conductive material thereof, is each configured to be superconducting when conducting current below a first critical current. By way of non-limiting example, the first critical current may be on the order of 1000 Amps. The primary coil assembly 30 is configured to produce a static, stable, and spatially uniform magnetic field (also referred to as a B0 field) across the bore 28.

Figure 2:
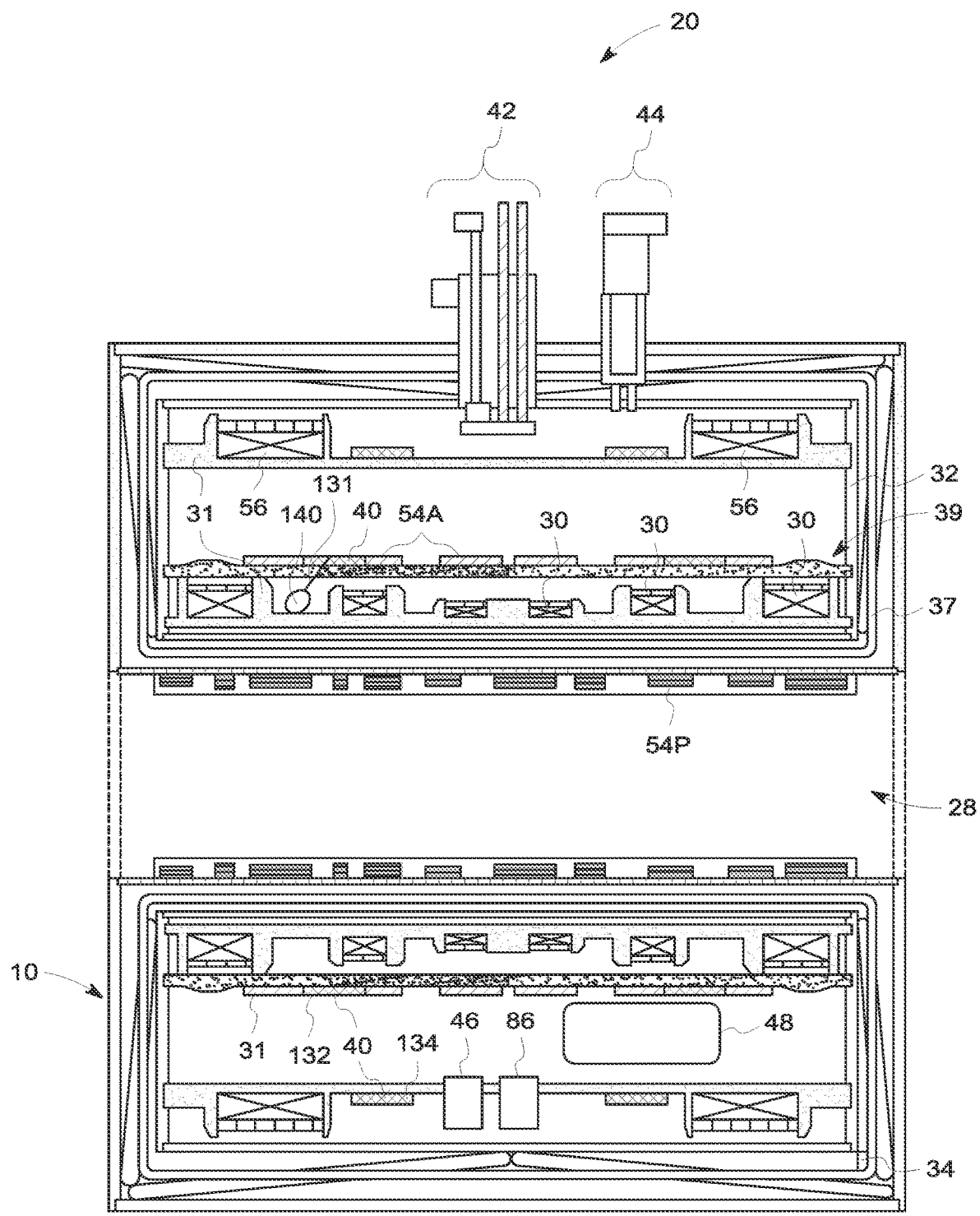
FIG. 2 is a sectional side view of an MRI system similar to that of FIG. 1.

As shown in FIGS. 1 and 2, the primary coil assembly 30 is surrounded by a cryostat vessel 32 that is filled with liquid helium. The liquid helium is used to maintain temperatures in the primary coil assembly 30 (as well as the EMI shielding coil assembly 40 within the magnet system 20, discussed below) at near absolute zero. These low temperatures provide superconducting capability through the primary coil assembly 30 and likewise through the EMI shielding coil assembly 40. The liquid helium is maintained under vacuum within the cryostat vessel 32, which can be punctured to quench the primary coil assembly 30 in an emergency via the vacuum port 34 as discussed in the BACKGROUND section above. The outer surface of the cryostat vessel 32 is surrounded by thermal insulation 36 and a thermal shield 37 in a manner known in the art so as to maximize cooling of the primary coil assembly 30 and the EMI shielding coil assembly 40. Additional thermal insulation 39 may also be provided between the primary coil assembly 30 and the EMI shielding coil assembly 40 to generally prevent thermal communication therebetween, subject to an important exception discussed below.

The gantry 26 further supports an EMI shielding coil assembly 40 so as to be positioned inside the primary coil assembly 30, as introduced above. The EMI shielding coil assembly 40 is comprised of one or more coil sections formed of a conductive material (e.g., a metallic wire) that is wrapped around a coil form 31 in a manner known in the art. The EMI shielding coil assembly 40 and particularly the conductors therein are configured to be superconducting when conducting current below a second critical current, which is discussed further below. By way of non-limiting example, the second critical current may be on the order of 100 Amps. The EMI shielding coil assembly 40 is configured to shield or protect the B0 field produced by the primary coil assembly 30 from low frequency electromagnetic interference (EMI), for example low frequency EMI caused by nearby traffic, parking lots, or moving metallic items that create magnetic flux near the MRI system, in a manner known in the art.

The MRI systems 10 of FIGS. 1 and 2 further include additional coil assemblies supported by the gantry 26 inside the primary coil assembly 30, which provide various functions presently known in the art. These additional coil assemblies 50 may include magnetic gradient coils 52, active shims 54A and passive shims 54P, bucking coils 56, and/or an RF transmit coil assembly (not shown). For MRI systems presently known in the art, the magnetic gradient coils, which include one or more coil sections that collectively generate a magnetic gradient within the B0 field generated by the primary coil assembly 30 along the any of the three X, Y, and Z axes. Similarly, the RF transmit coil assembly includes one or more coils that transmit and/or receive magnetic pulses present within the bore 28. The other coils and components supported by the gantry 26 for MRI systems presently known in the art may be positioned and insulated so as to be thermally isolated from each other.

FIG. 2 further shows power leads 42 through which power is provided to the MRI system 10, as well as a cold head and condenser 44 through which refrigerant is communicated with the MRI system 10, each in a manner known in the art. A main switch 46 is also shown, which controls the operational state of the MRI system 10. The main switch 46 provides a mechanism for charging or discharging the superconducting coils with essentially zero resistance in a manner known in the art. A quench protection control system 48 is also provided, which controls the power provided to the different coils during a quench situation to as to minimize damage thereto. The quench protection control system 48 may also be configured function in a conventional manner. In short, the quench protection control system 48 detects when a quench event is first initiated at its origin (e.g., when a first location within a superconducting coil loses its superconducting state and becomes resistive). The quench protection control system 38 subsequently quenches the entire magnet to evenly dump the energy stored in the magnet into the entire cold mass. This prevents the magnet from being burned due to all the energy dumped into the quench original and its vicinity. In other words, the quench protection control system 48 protects the superconducting magnet during a quench event Returning to FIG. 1, the processing portion 24 of the MRI system 10 generally includes a controller 60, a primary magnetic field controller 62, an EMI shielding coil controller 64, a gradient field control 65, an RF transmitter 66, an RF transmit-receive (T-R) switch 68, an RF receiver 70, a memory 72, and a display device 74. The controller 60, particularly via the primary magnetic field controller 62, controls the flow of current through the primary coil assembly 30 to thereby control the strength of the electromagnetic B0 field in the bore 28. Similarly, the controller 60 controls the flow of current through the EMI shielding coil assembly 40 via the EMI shielding coil controller 64, and the flow of current through the magnetic gradient coils via the gradient field controller 65. The controls provided by the controller 60 may be as generally known in the art.

The T-R switch 68 selectively electrically couples the RF transmit coil assembly to the RF transmitter 66 and to the RF receiver 70. The controller 60, via the T-R switch 68, causes radio frequency (RF) field pulses to be generated by the RF transmitter 66, which causes excitation of magnetic resonance in the object within the bore 28. In certain embodiments, the RF transmitter 66 generate signals at resonate frequencies centered around the Larmor frequencies of a proton (hydrogen nuclei) and/or carbon (e.g., a 13C nuclei). The RF receiver 70 is disconnected by the T-R switch 68 while these RF excitation pulses are being generated. The T-R switch 128 then disconnects the RF transmit coil assembly from the RF transmitter 66 and to connects the RF receiver 70 to the RF transmit coil assembly. This enables the RF receiver 70 to receive the MR signals resulting from the excited nuclei in the object caused by the RF excitation pulses. These MR signals are received by the controller 60, which via processing techniques presently known in the art are used to produces an image of the object.

Figure 3:
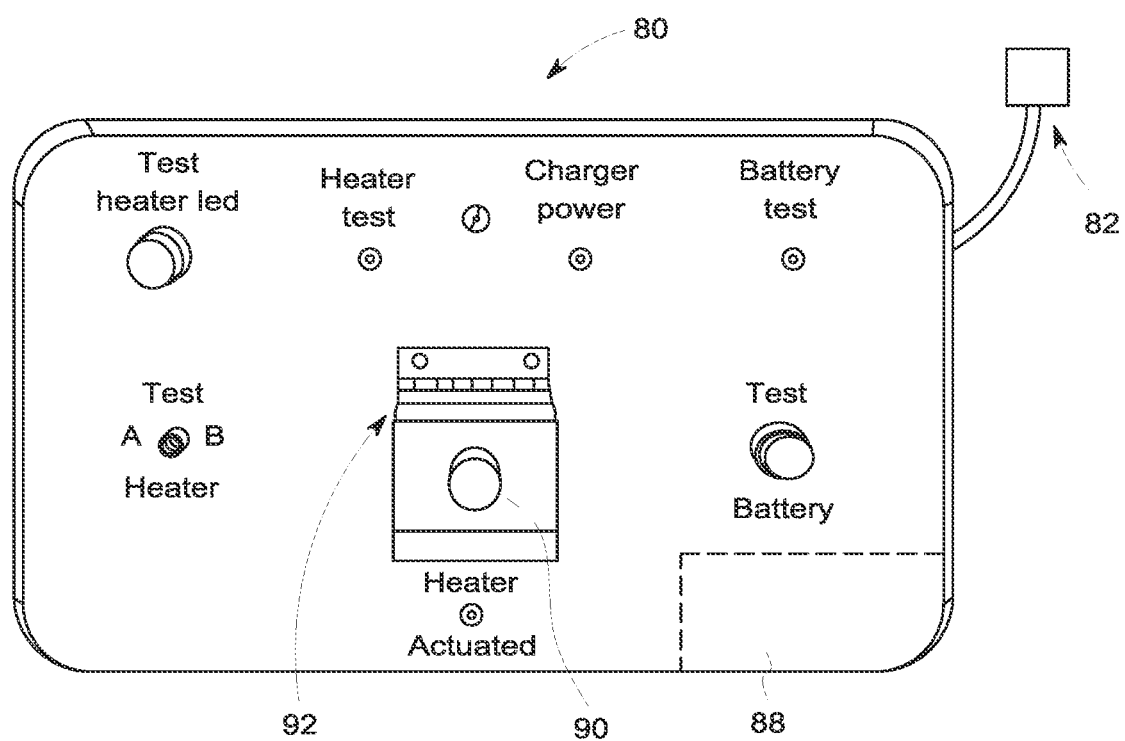
FIG. 3 is a front view of a magnetic rundown unit as presently known in the art.

FIG. 3 shows an example of a magnet rundown unit 80 (also referred to as an MRU) similar to those presently known in the art. The magnet rundown unit 80 includes a connector 82 configured to electrically couple the magnet rundown unit 80 to the MRI system 10, specifically via plugging into a like connector 84 (FIG. 1) accessible on the exterior of the MRI system 10. As discussed in the BACKGROUND section above, the connector 84 on the exterior of the MRI system 10 is electrically coupled to a heater 86 inside the MRI system 10 that is configured to produce heat when power is provided thereto. This causes the superconducting magnets within the MRI system 10 to quench due to the increased heat, no longer being superconductive. The power is provided to the heater 86 via a power source 88 within the magnet rundown unit 80, such as a battery. The magnet rundown unit 80 is activated (i.e., to provide power from the power source 88 to the heater 86 in the MRI system 10) via actuating a switch 90. Since activating the magnet rundown unit 80 causes the MRI system 10 to quench, thereby stopping any in-process imaging and potentially causing damage to components of the MRI system 10, the switch 90 is protected from accidental actuation via a pivoting cover door 92. In this manner, the magnet rundown unit 80 is part of one method known in the art for quenching the MRI system 10, which remains available as an alternative or backup to the new quenching methods provided by the MRI system 10 presently disclosed.

Figure 4:
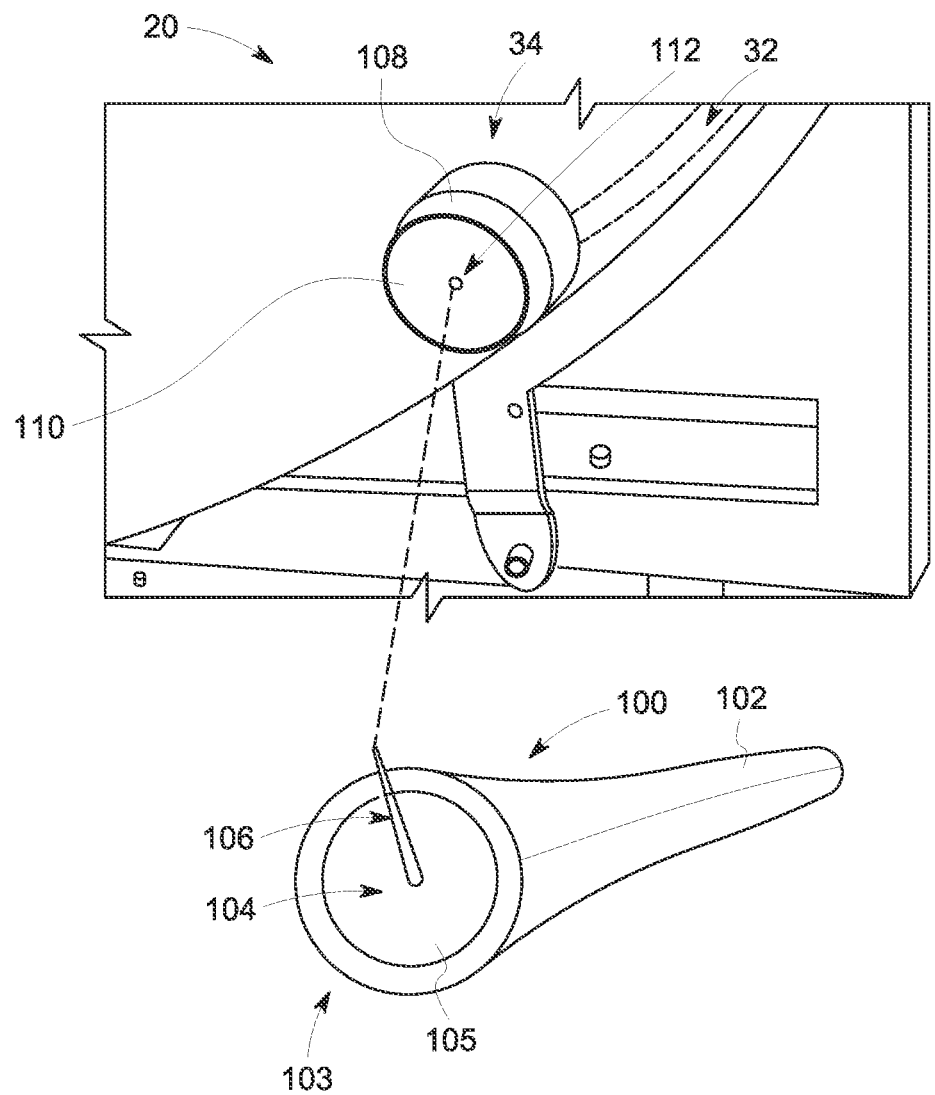
FIG. 4 is a partial front view of an MRI system showing a vacuum port and corresponding tool for puncturing the vacuum port for quenching the MRI system.

FIG. 4 shows an example of a mechanism for quenching the MRI system 10 via another method presently known in the art. As discussed above, the MRI system 10 includes a vacuum port 34 through which the vacuum of the cryostat vessel 32 containing the liquid helium supercooling the magnets may be ruptured. In particular, the vacuum port 34 has exterior walls 108 extending perpendicularly away from the MRI system 10. A front face 110 is formed perpendicularly to the walls 108, whereby in the present example the front face 110 is parallel to the exterior of the MRI system 10. A puncture hole 112 is defined within a front face 110, which may be a through-hole, or a region of the front face 110 that is thinner or otherwise weakened relative to the surrounding portion of the front face 110.

FIG. 4 also depicts an example of a tool 100 configured to work in conjunction with the vacuum port 34 to break the vacuum within the cryostat vessel 32 when necessary. The tool 100 extends from a handle 102 at one end to a head 103 at an opposite end. A cavity 104 is formed within the head 103 of the tool 100 and is configured to correspond to the exterior walls 108 and front face 110 of the vacuum port 34 such that the vacuum port 34 may be substantially positioned within the cavity 104 when the tool 100 is in use. A pin 106 extends outwardly from a base 105 of the cavity 104 and is centered within the cavity 104. The pin 106 may be made metallic, for example formed of steel. The handle 102 and remainder of the tool 100 may also be metallic or may be formed of another material, such as plastic. In this manner, the engagement between the exterior walls 108 and the cavity 104 provides alignment between the pin 106 of the tool 100 and the puncture hole 112 of the vacuum port 34. When the pin 106 and the puncture hole 112 are aligned, pressing the pin 106 inwardly towards the puncture hole 112 physically punctures a portion of the cryostat vessel 32 to thereby break the vacuum therein. As discussed above, puncturing the vacuum within the cryostat vessel 32 greatly reduces the ability of the refrigeration system to cool the primary coil assembly 30 and the EMI shielding coil assembly 40, quenching the superconducting magnets within the MRI system 10.

The present inventors have recognized that each of these prior art mechanisms for quenching an MRI system have a risk of failure, which thereby risks the safety of patients and equipment when failing to quench the MRI system in the event of an emergency. For example, the magnet rundown unit 80 is a device separate from the MRI system, and thus may not be readily available in an emergency. In certain examples, the magnet rundown unit 80 may be kept in a centralized location within a medical facility, causing delay to locate and obtain the magnet rundown unit 80 for use. The magnet rundown unit 80 may also be missing from its designated storage position when an operator suddenly needs it. In addition, the magnet rundown unit 80 must be maintained (e.g., battery charged, battery replacements), tested, and calibrated over time. The operator may find that the battery, switch, 90, wires, and/or connectors 82 have failures, preventing the magnet rundown unit 80 from being used to quench the MRI system 10. The magnet rundown unit 80 is also susceptible to damage, for example from being dropped on the ground. On the opposite end, even if the magnet rundown unit 80 is fully functional, the heater 86 within the MRI system 10 may be inoperable and/or operating in a diminished capacity, slowing or preventing the heater 86 from quenching the MRI system 10.

There are also risks of failure when relying on the tool 100 for breaking the vacuum via the vacuum port 34 to quench the MRI system 10. As with the magnet rundown unit 80, the tool 100 may be difficult to locate within a medical facility. The tool 100 may also be ineffective due to damage, for example with the pin 106 being bent or missing or cracks in the head 103 of the tool 100. Another possibility is that the puncture hole 112 is improperly machined or sized such that the pin 106 cannot enter enough to puncture the cryostat vessel 32. Likewise, the walls of the cryostat vessel 32 aligned with the puncture hole 112 of the vacuum port 34 may be tougher than expected, causes the pin 106 to break rather than the pin 106 breaking the vacuum.

Another downside of the tool 100 is that even the tool 100 works as intended, the cryostat vessel 32 is necessarily damaged, requiring costly repairs.

For these and other reasons, the present inventors have developed an alternative mechanism for quenching an MRI system 10, which is also referred to as a two-stage quenching method or system.

Figure 5:
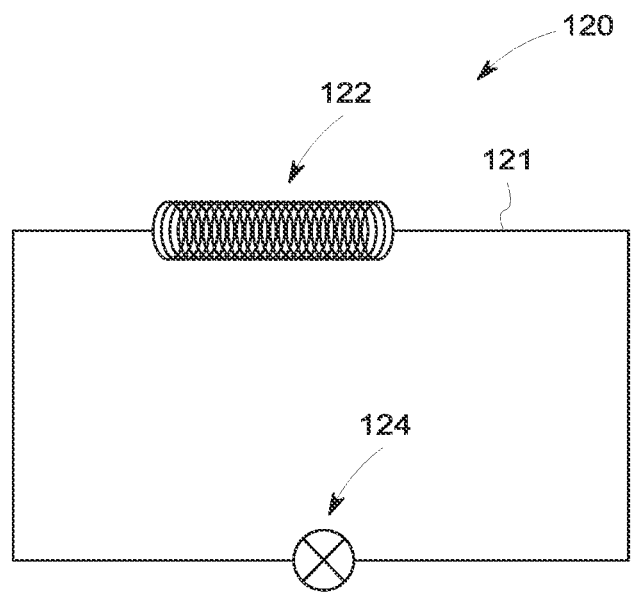
FIG. 5 is a schematic representation of a primary coil assembly for use in an MRI system as presently known in the art.

FIG. 5 shows a high-level depiction of a primary coil assembly 120 configured to produce a static, stable, and spatially uniform magnetic field (the B0 field) across the bore 28 of the MRI system 10 in a manner known in the art. The primary coil assembly 120 includes a coiled section 122 that is electrically coupled via conductors 121 to form a circuit. By way of non-limiting example, the coiled section 122 may comprise niobium-titanium or other conventionally known materials. A switch 124 is wired in series with the coiled section 122 and is operable to selectively open and close the circuit of the primary coil assembly 120. The switch 124 (which may be the same as the switch 46 shown in FIG. 2) provides a mechanism for allowing current flowing through the primary coil assembly 120 to be removed therefrom. As discussed above, when switch 124 is open, it introduces electrical resistance into the primary coil assembly 120 (which previously essentially zero resistance) such that the primary coil assembly 120 becomes a typical R-L (non-superconducting) circuit. Without any external power supply, the current will naturally decay within primary coil assembly 120. When external power supply is connected properly in parallel with switch 124, the current in primary coil assembly 120 can be removed much faster than the natural decay mentioned above, as known in the art. The example of FIG. 5 shows the primary coil assembly 120 having one coiled section 122, which may be incorporated as the primary coil assembly 30 within a magnet system 20 for an MRI system 10 according to the present disclosure. However, the present disclosure also contemplates primary coil assemblies having more than one coiled section.

The coiled section 122 and the conductors 121 are each configured to be superconducting as long as the current flowing therethrough remains below a first critical current (e.g., the first critical current being on the order of 1000 Amps as discussed above). Once the current flowing through the primary coil assembly 120 exceeds the first critical current, the resistance through the primary coil assembly 120 increases substantially, no longer being superconducting. When the resistance through the primary coil assembly 120 is greater than zero, the current through the primary coil assembly 120 is dramatically reduced, as is the magnetic field produced thereby. In other words, the primary coil assembly 120 is superconducting when the current flowing therethrough is below the first critical current and becomes quenched when the current flowing therethrough exceeds the first critical current.

Additionally, the continued flow of current through the primary coil assembly 120 after quenching (i.e., when the resistance is no longer essentially zero) generates heat. This heat exceeds the cooling capability of the MRI system's refrigeration system, causing the liquid helium within the cryostat vessel 32 to vaporize and boil off.

Figure 6:
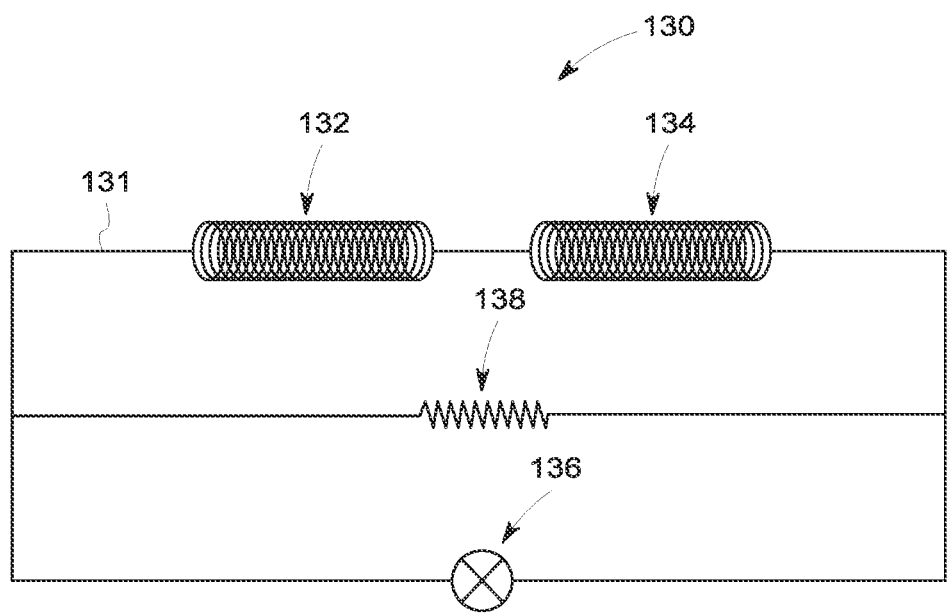
FIG. 6 is a schematic representation of an EMI shielding coil assembly for use in an MRI system as presently known in the art.

FIG. 6 shows a high-level depiction of an electromagnetic interference (EMI) shielding coil assembly 130 as generally known in the art, which protects the B0 field from low frequency EMI as discussed above. By way of example, external electromagnetic interference for an MRI system in the field is typically on the mG (milliGauss) level, causing current to be generated within the EMI shielding coil assembly 130 at the mA level.

The EMI shielding coil assembly 130 includes a first coil section 132 and a second coil section 134 each configured to produce a magnetic field when current flows therethrough. The first coil section 132 and the second coil section 134 are electrically coupled together in series to form a circuit via conductors 131. A switch 136 is wired in series with the first coil section 132 and the second coil section 134 to as to selectively open and close the circuit therethrough. The switch 136 provides a mechanism for allowing current flowing through the EMI shielding coil assembly 130 to be removed therefrom. when the switch 136 is open, it introduces electrical resistance into the EMI shielding coil assembly 130 (which previously has essentially zero resistance) such that the EMI shielding coil assembly 130 becomes a typical R-L (non-superconducting) circuit. Without any external power supply, the current flowing in EMI shielding coil assembly 130 quickly decays to zero as known in the art. In the example shown, a current limiter (shown as resistor 138) is wired in parallel with the first coil section 132 and the second coil section 134.

The EMI shielding coil assembly 130 of FIG. 6 is also susceptible to quenching in the same manner as the primary coil assembly 120. However, the EMI shielding coil assembly 130, and particularly the conductors therein (e.g., the conductors 131, the first coil section 132, and/or the second coil section 134) may be superconducting when conducting current below a second critical current that is different than the first critical current of the primary coil assembly 120.

Figure 7:
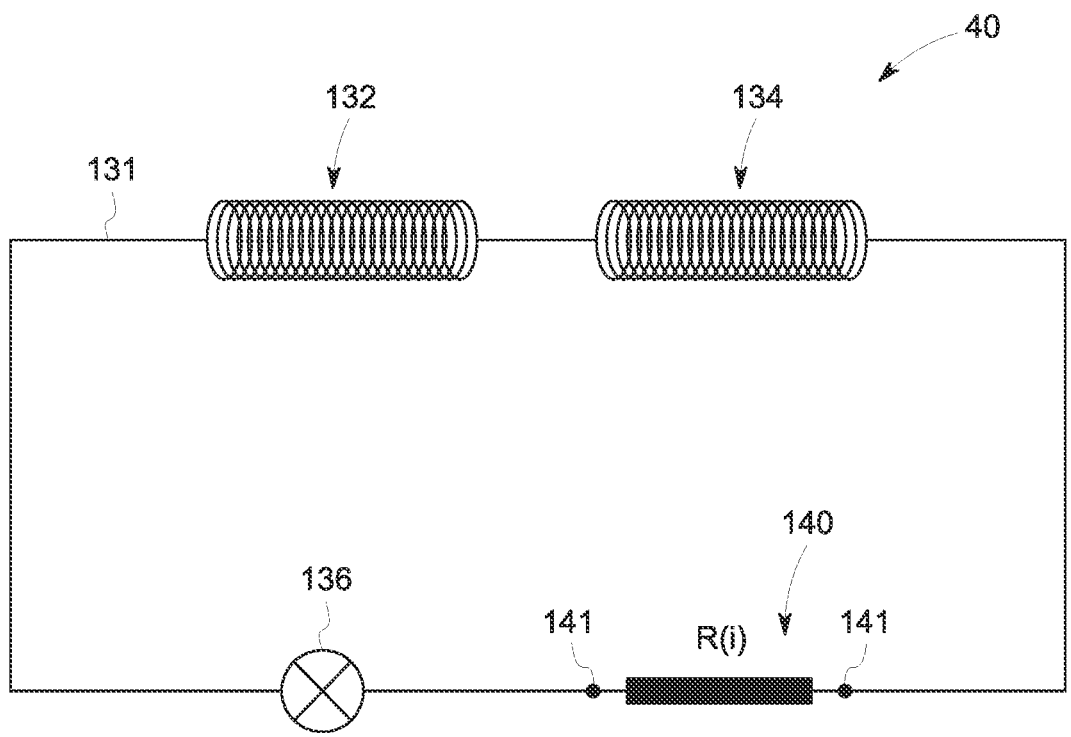
FIG. 7 is a schematic representation of an EMI shielding coil assembly incorporating a variable resistor according to the present disclosure.

FIG. 7 shows an EMI shielding coil assembly 40 according to the present disclosure, which as discussed above is part of magnet system 20 within the imaging portion 22 of the MRI system 10 (see e.g., FIG. 1). The EMI shielding coil assembly 40 incorporates components that are the same or similar to those conventionally known in the art, such as within the EMI shielding coil assembly 130 shown in FIG. 6. Therefore, the same numbering is used where a given component could be the same as those used for the EMI shielding coil assemblies 130 shown in FIG. 6. In the example shown in FIG. 7, the EMI shielding coil assembly 40 includes a first coil section 132 and a second coil section 134 that are again electrically coupled together in series via conductors 131 to form a circuit. While this example shows an EMI shielding coil assembly 40 having specifically two coil sections, it should be recognized that the present disclosure also contemplates configurations in which there are greater or fewer coil sections within the EMI shielding coil assembly 40.

With continued reference to FIG. 7, the first coil section 132 and the second coil section 134 are also connected in series to a switch 136, which may be in a conventional switch as known in the art. The switch 136 enables the MRI system 10 to selectively open and close the EMI shielding coil assembly 40 circuit to dump the current flowing through the first coil section 132 and the second coil section 134 as needed. For example, the current may be dumped to discontinue the superconducting through the EMI shielding coil assembly 40 so as to stop producing a magnetic field via the first coil section 132 and the second coil section 134. In this example, a current limiter is not shown. However, the present disclosure contemplates alternative configurations in which a current limiter such as the resistor 138 shown in FIG. 6 may be incorporated into the circuit of the EMI shielding coil assembly 40 of FIG. 7. For example, a resistor 138 may be wired in parallel to the first coil section 132 and the second coil section 134 (which are themselves electrically coupled together in series).

In contrast to the configuration of FIG. 6, the EMI shielding coil assembly 40 of FIG. 7 now incorporates a variable resistor 140, which is wired in series with the first coil section 132, the second coil section 134, and the switch 136. The variable resistor 140, like the first coil section 132 and the second coil section 134, is configured to be superconducting during normal operation of the magnet system 20 and the MRI system 10 more generally. However, in this case, the variable resistor 140 specifically configured to be superconducting when conducting current below a third critical current. The third critical current is less than the first critical current of the primary coil assembly 30, and also less than the second critical current of the EMI shielding coil assembly 40. In this manner, the variable resistor 140 is particularly designed to be the most sensitive part of the superconducting circuit within the EMI shielding coil assembly 40, and more sensitive than the primary coil assembly 30.

In certain examples, the variable resistor 140 is a separate element electrically coupled to the conductors 131, the first coil section 132, and/or the second coil section 134. For example, the variable resistor 140 may be a small length of a conductor having a lower current carrying capacity coupled to the circuit via superconducting joints 141. By way of non-limiting example, the variable resistor 140 may comprise niobium-titanium with a copper/nickel or copper/manganese matrix with the conductors 131, first coil section 132, and second coil section 134 comprising niobium-titanium with a copper matrix. The superconducting joints 141 may comprise properties of superconducting joints presently known in the art. The present inventors have recognized that variable resistor 140 may also be formed of a different material matrix than the remainder of the conductors in the EMI shielding coil assembly 40, for example being comprised of copper and nickel versus copper and manganese. Using different material matrices provides the additional benefit of further increasing the effective resistance through the variable resistor 140. The present inventors have recognized that, in certain embodiments, using different matrix material for the variable resistor 140 can provide a higher resistance when quenching in the EMI shielding coil assembly 40 with the same current. This higher resistance generates more heat, thereby quenching the primary coil assembly 120 according the present disclosure even faster.

In other examples, the variable resistor 140 is a portion of one or more of the conductors 131, the first coil section 132, and/or the second coil section 134 itself, having been modified to have a lower current carrying capacity. For example, a portion of the conductors 131, the first coil section 132, and/or the second coil section 134 may be subjected to a heat treatment that degrades the critical current through that portion.

In other examples, the variable resistor 140 is a portion of one or more of the conductors 131, the first coil section 132, and/or the second coil section 134 having little to no twist pitch in the wire. The present inventors have recognized that this change in pitch, relative to the remaining conductors within the EMI shielding coil assembly 40, not only provides the benefit of increasing the resistance within the variable resistor 140, but also results in a faster rate of change in increasing the resistance.

Figure 8:
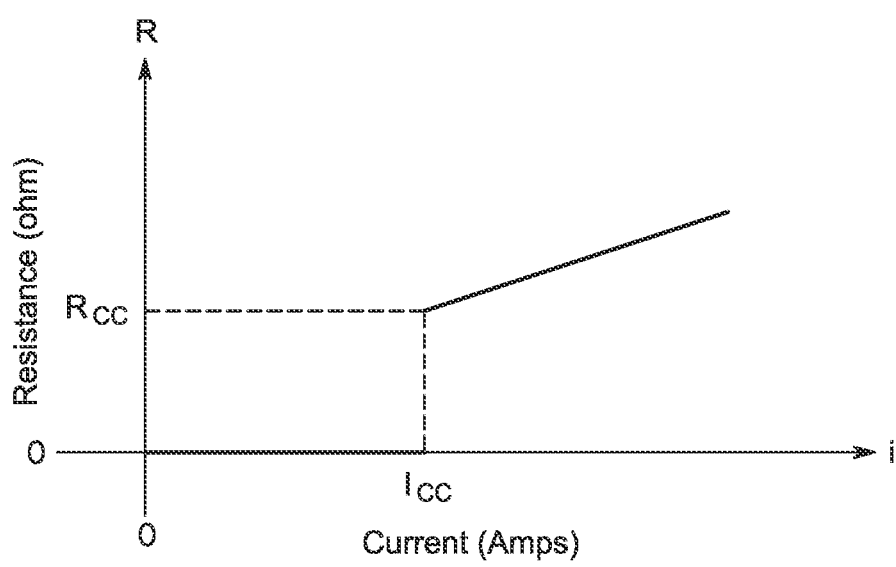
FIG. 8 is a graph depicting the electrical characteristics of the variable resistor of FIG. 7 in use.

It should be recognized that any of these examples of variable resistors 140, when current is conducted through the variable resistor 140 in excess of the third critical current, the resistance substantially increases, as shown in FIG. 8. In particular, the resistance is essentially zero when the current through the variable resistor 140 is between zero and the third critical current ICC. Once the current through the variable resistor 140 exceeds the third critical current ICC, the resistance increase in a step-like manner from zero to a non-zero value, shown here as a resistance at critical current RCC. The resistance then continues to increase further as the current through the variable resistor 140 rises further, here as a linear function. In certain examples, the variable resistor 140 is configured to have a third critical current ICC between 5 and 10 Amps, which results in a resistance at critical current RCC of 0.1 Ohms. Once the variable resistor 140 is non-superconducting, the entire EMI shielding coil assembly 40 becomes non-superconducting, or in other words becomes quenched.

It should be recognized that the heating power of the variable resistor 140 when no longer superconducting is the product of the current squared and the resistance: $P=i^2 \times R$. Therefore, in a configuration of the variable resistor 140 having a third critical current ICC of between 5 and 10 Amps and a resistance at critical current RCC of 0.1 Ohm, between 2.5 and 10 watts of power are generated at the third critical current (which only increases as the resistance and current rise further). It should be further recognized that these examples of currents, resistance, and power are merely examples and the present disclosure contemplates broader ranges for these values, such as third critical currents being on the order of 10 Amps or between 3 Amps and 50 Amps) and resistances at critical current RCC between 0.1 Ohm and 1 Ohm.

Figure 9:
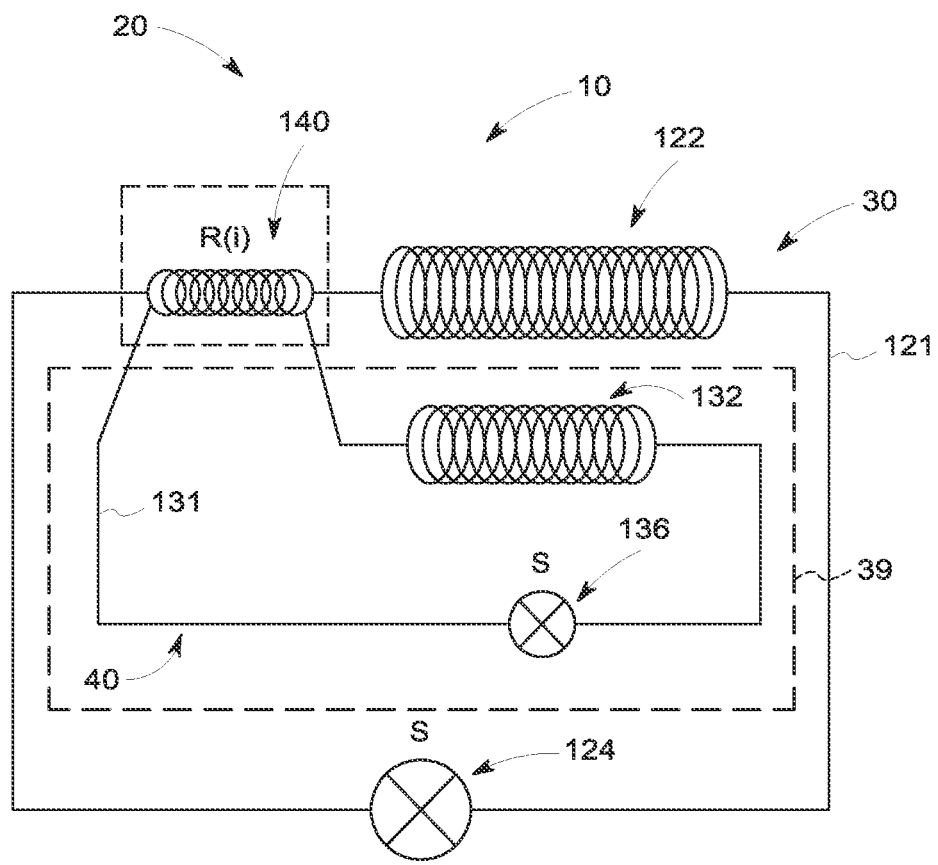
FIG. 9 is a schematic representation of a magnet system according to the present disclosure, including both a primary coil assembly and an EMI shielding coil assembly.

Through experimentation and development, the present inventors have recognized that 2.5 to 10 watts of power would be sufficient to also quench the primary coil assembly 30 if the variable resistor 140 (or another part of the EMI shielding coil assembly 40 when non-superconducting) is positioned sufficiently close to the primary coil assembly 30. FIG. 9 is a schematic representation of a magnet system 20 according to the present disclosure, which includes a primary coil assembly 30 similar to that of FIG. 5. The magnet system 20 includes an EMI shielding coil assembly 40 similar to that of FIG. 7, but now depicts only the first coil section 132 for simplicity. The EMI shielding coil assembly 40 includes a variable resistor 140 as described above, which is positioned in close-proximity to a portion of the primary coil assembly 30. Through experimentation and development, the present inventors have determined that the systems and methods disclosed herein allow energy at even very low levels (e.g., the millijoule level) to be used to quench the system.

In the example shown, the variable resistor 140 is positioned adjacent to one of the conductors 121 within the primary coil assembly 30, rather than being adjacent to the coiled section 122. However, it should be recognized that there is flexibility in where the variable resistor 140 is positioned, which for example may alternatively be near or even inside the coil of the coiled section 122. In certain examples, the variable resistor 140 is also formed in a coiled shape and is at least partially wound along with the conductors inside the coiled section 122 of the primary coil assembly 30 so as to be coaxially aligned with each other. Providing the variable resistor 140 in direct thermal contact with the conductor 121 and/or coiled section 122 is an efficient configuration for transferring heat such that the variable resistor 140 may quench the primary coil assembly 30 in the manner presently disclosed.

With reference to FIGS. 2 and 9, the present inventors have recognized that by providing the variable resistor 140 as a portion of the EMI shielding coil assembly 40 distinct from the first coil section 132, thermal insulation 39 and/or other shielding may advantageously still be used to isolate the primary coil assembly 30 and the EMI shielding coil assembly 40.

In this manner, the magnet system 20 of FIG. 9 is configured such that when the current through the variable resistor 140 exceeds the third critical current, the EMI shielding coil assembly 40 is quenched (stage 1 of quenching), as well as the primary coil assembly 30 (stage 2 of quenching). Moreover, this alternative quenching mechanism provides that the primary coil assembly 30 may be quenched by causing current flow through the variable resistor 140 that exceeds the third critical current but does not exceed the first critical current of the primary coil assembly 30.

Figure 10:
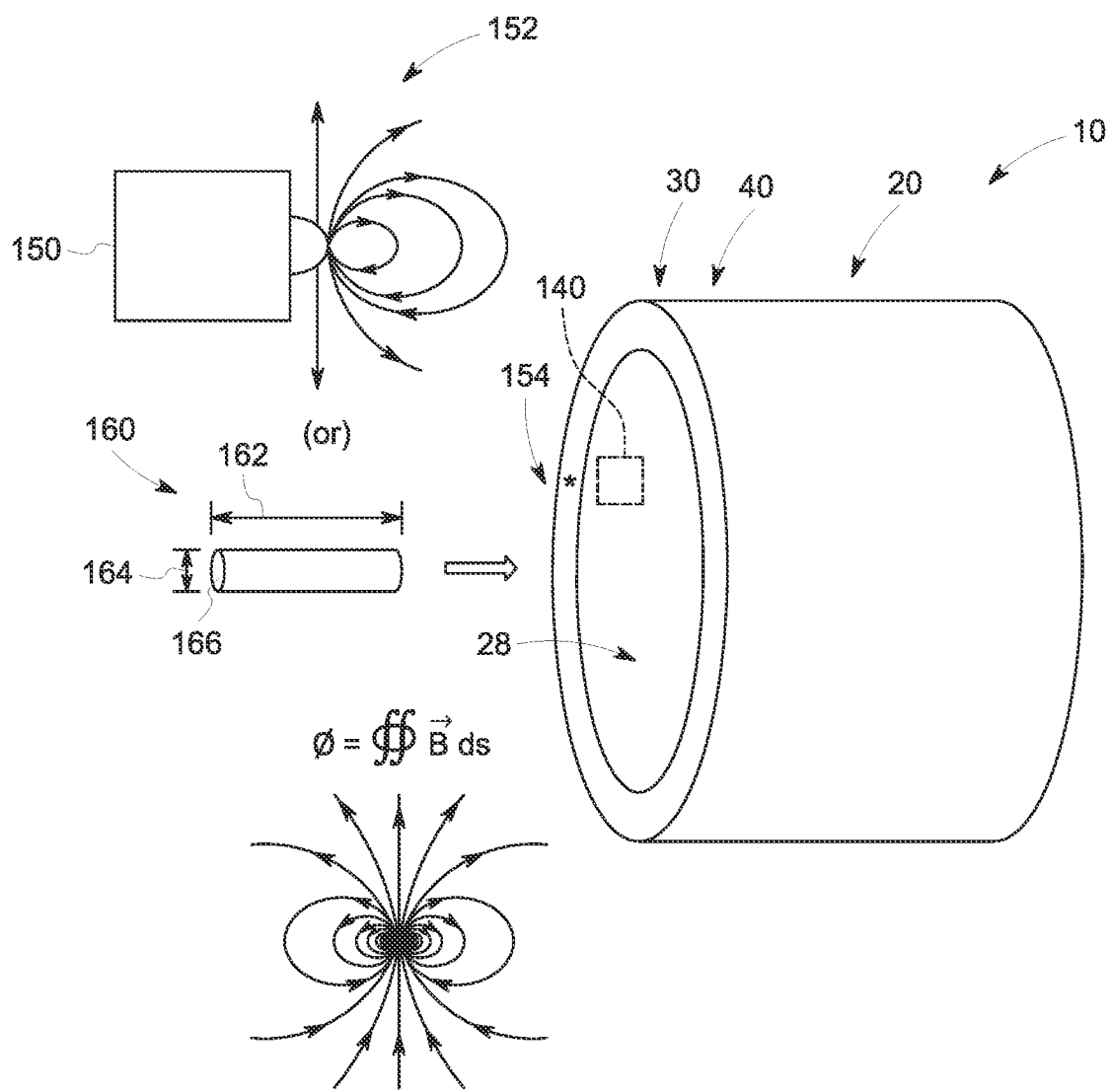
FIG. 10 is an isometric view of an MRI system configured according to the present disclosure, along with a ferrous object or a magnetic flux generator for quenching the MRI system.

With reference to FIG. 10, the present inventors have further identified that the magnet system 20 disclosed herein provides multiple methods for quenching the primary coil assembly 30 via quenching the variable resistor 140. First, a magnetic flux generator 150 (e.g., an external magnetic coil) may be positioned near the EMI shielding coil assembly 40 and activated to produce a magnetic flux 152 in a manner known in the art. A permanent magnet may also be used as the magnetic flux generator 150. The EMI shielding coil assembly 40 may be positioned within the bore 28 such that the magnetic flux generator 150 is sufficiently close whenever operated within the bore 28. In another example, a label 154 is provided on the exterior of the MRI system 10 to indicate to the user where to position the magnetic flux generator 150. In certain examples, this label 154 may be next to the connector 84 for plugging in the magnet rundown unit 80 (FIG. 3) discussed above. The magnetic flux generator 150 may integrated within, or stored with, the magnet rundown unit 80 for convenience and ease of training personnel.

Due to the proximity to the EMI shielding coil assembly 40, the magnetic flux created by the magnetic flux generator 150 generates current through the EMI shielding coil assembly 40, including within the variable resistor 140. The magnetic flux generator 150 may be operated such that the current created through the variable resistor 140 exceeds the third critical current, quenching the EMI shielding coil assembly 40, followed by the primary coil assembly 30. Through experimentation and development, the present inventors have recognized that while a typical level of electromagnetic interference (EMI) experienced by the system my range from 1-10 milliGauss, the magnetic flux introduced by the presently disclosed system and methods may be on the order of 1-10 Gauss. This is a 1000-fold increase over ambient EMI, thereby also providing a substantial safety factor such that the systems and methods described herein do not cause accidental quenching events.

The present inventors have further configured the magnetic system 20 disclosed herein to also be capable of quenching the primary coil assembly 30 without requiring any powered devices (the magnet rundown unit 80 or a magnetic flux generator 150), and without puncturing the cryostat vessel via the tool 100 (FIG. 4) discussed above. In particular, the variable resistor 140 is configured such that moving a ferrous object 160 in proximity to the variable resistor 140 is sufficient to create a flux therein causing a current exceeding the third critical current. In the example shown, the ferrous object 160 is a piece of steel having a length 162, a width 164, and a cross-section 166. Through experimentation and development, the present inventors have discovered that the ferrous object 160 generates the greatest flux when moved near the EMI shielding coil assembly 40 when shaped as a cylinder, and next as a rod. In certain examples, the flux created by the ferrous object 160 was 20 to 40 times greater when having a cylindrical cross-section 166 as compared to a cube or sphere.

The ferrous object 160 may be sized, for example the length 162 and the width 164 to provide sufficient mass such that the flux generated when moved near the EMI shielding coil assembly 40 creates a current exceeding the third critical current. In certain examples, the present inventors have identified that a ferrous object 160 having a mass between 5 and 10 kg created currents within the EMI shielding coil assembly 40 100 to 1000 times greater than those caused by typical EMI disturbances, such as metal moving in the vicinity from traffic and/or the like. In this manner, the magnet system 20 and the MRI system 10 more generally is configured to be selective quenched in this third manner, while also avoiding the risk of a false trigger since typical disturbances produce so much less current in the EMI shielding coil assembly 40.

The present inventors have further recognized that by using a simple ferrous object 160 to quench the primary coil assembly 30 in an emergency situation, these devices may be cost effectively provided on location for every MRI system 10. Returning to FIG. 1, one example mechanism for safely storing a ferrous object 160 near the MRI system 10 provides for sufficiently strapping the ferrous object 160 to the wall 12. The ferrous object 160 is supported on a platform 175, which may be the floor of the room in which the MRI system 10 is situated, or may be positioned above the ground. Straps 170 removably couple the ferrous object 160 to the wall 12, which may be held in place via fasteners 172 such as snaps, clamps, or locking mechanisms (e.g., a dead bolt like rod extending through a chain as the strap 170). In this manner, the operator can quickly remove the ferrous object 160 from the wall 12 in an emergency without the need for tools, or the need to leave the room. Depending on the mass, size, and shape of the ferrous object 160, as well as different safety concerns (including not allowing the ferrous object 160 to be unintentionally pulled out of the operator's grasp), the ferrous object 160 may be provided on a cart 174. The cart 174 may also be removably fastened in place within the room when not in use in a similar manner to the ferrous object 160 discussed above. It should be recognized that the ferrous object 160 may also be kept outside the room.

Figure 11:
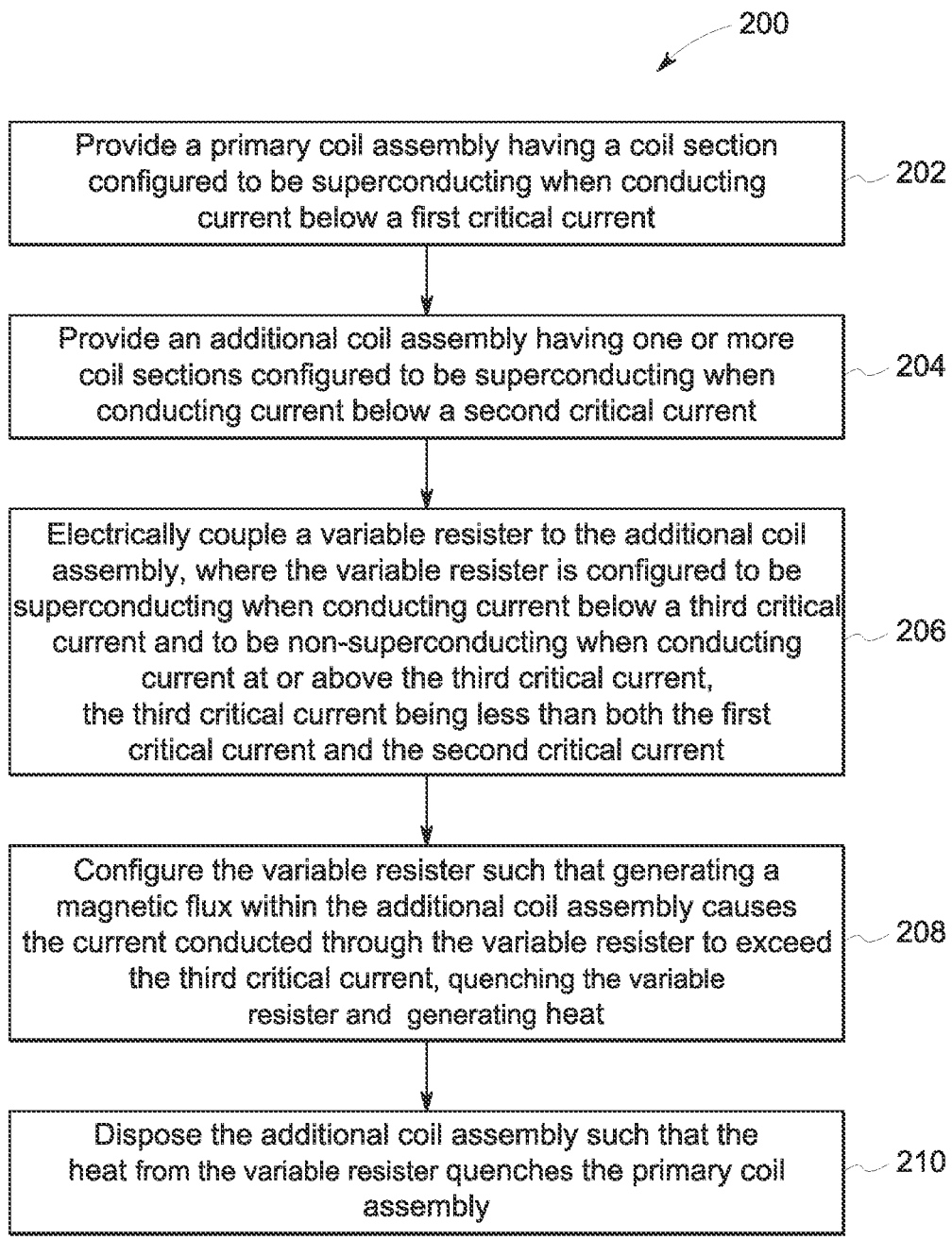
FIG. 11 is a flow chart of an example method for quenching an MRI system according to the present disclosure.

FIG. 11 is a flow chart showing one example of a method 200 for making a superconducting magnet system having two-stage quenching according to the present disclosure. Step 202 provides for providing a primary coil assembly having a coil section configured to be superconducting when conducting current below a first critical current. Step 204 provides for providing an EMI shielding coil assembly having one or more coil sections configured to be superconducting when conducting current below a second critical current. Step 206 provides for electrically coupling a variable resistor to the EMI shielding coil assembly, where the variable resistor is configured to be superconducting when conducting current below a third critical current and to be non-superconducting when conducting current at or above the third critical current, the third critical current being less than both the first critical current and the second critical current. In step 208, the variable resistor is configured such that generating a magnetic flux within the EMI shielding coil assembly causes the current conducted through the variable resistor to exceed the third critical current, quenching the variable resistor and generating heat. Step 210 provides for disposing the EMI shielding coil assembly such that the heat from the variable resistor quenches the primary coil assembly.

In this manner, the present inventors have developed the systems and methods disclosed herein as another mechanism for quenching the primary coil assembly 30 of an MRI system 10 as needed. These systems and methods advantageously permit the use of many components known for use in MRI systems presently known in the art. Likewise, the new two-stage quenching mechanism does not prevent the use of other quenching mechanisms presently known in the art, but instead offers a simpler, more convenient, and more cost-effective solution for quenching as needed.

It should be recognized that while the present disclosure generally focused on MRI systems, and using such systems for imaging patients, other uses are also contemplated. For example, the MRI system may be combined with other types of medical imaging technology, such as Computed Tomography (CT), Positron Emission Tomography (PET), a Single Photon Emission Computed Tomography (SPECT), ultrasound, or any other system for generating images. Additionally, the systems disclosed herein need not be limited to systems for imaging patient (human or animal) but may also be used for security or other purposes (e.g., airport luggage scanners).

The functional block diagrams, operational sequences, and flow diagrams provided in the Figures are representative of exemplary architectures, environments, and methodologies for performing novel aspects of the disclosure. While, for purposes of simplicity of explanation, the methodologies included herein may be in the form of a functional diagram, operational sequence, or flow diagram, and may be described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology can alternatively be represented as a series of interrelated states or events, such as in a state diagram. Moreover, not all acts illustrated in a methodology may be required for a novel implementation.

This written description uses examples to disclose the invention, including the best mode, and also to enable any person skilled in the art to make and use the invention. Certain terms have been used for brevity, clarity, and understanding. No unnecessary limitations are to be inferred therefrom beyond the requirement of the prior art because such terms are used for descriptive purposes only and are intended to be broadly construed. The patentable scope of the invention is defined by the claims and may include other examples that occur to those skilled in the art. Such other examples are intended to be within the scope of the claims if they have features or structural elements that do not differ from the literal language of the claims, or if they include equivalent features or structural elements with insubstantial differences from the literal languages of the claims.

What is claimed is:

1. A superconducting magnet system having two-stage quenching, the superconducting magnet system comprising:
    a primary coil assembly having a coil section configured to be superconducting when conducting current below a first critical current; and
    an EMI shielding coil assembly having one or more coil sections electrically coupled to a variable resistor, the one or more coil sections being configured to be superconducting when conducting current below a second critical current, and the variable resistor being configured to be superconducting when conducting current below a third critical current and to be non-superconducting when conducting current at or above the third critical current, wherein the third critical current is less than both the first critical current and the second critical current;
    wherein the EMI shielding coil assembly is configured such that generating a magnetic flux within the EMI shielding coil assembly causes the current conducted through the variable resistor to exceed the third critical current, quenching the variable resistor and generating heat; and
    wherein the EMI shielding coil assembly is disposed such that the heat from the variable resistor quenches the primary coil assembly.

2. The superconducting magnet system according to claim 1, wherein the variable resistor physically contacts the primary coil assembly.

3. The superconducting magnet system according to claim 1, wherein the variable resistor is at least partially coiled with the coil section of the primary coil assembly.

4. The superconducting magnet system according to claim 1, wherein the system is configured such that positioning a ferrous object with a magnetic moment in proximity to the EMI shielding coil assembly generates the magnetic flux within the EMI shielding coil assembly.

5. The superconducting magnet system according to claim 4, wherein the ferrous object is one of a metallic cylinder and a metallic rod having a mass between 2.5 kg and 20 kg.

6. The superconducting magnet system according to claim 4, wherein the system is configured such that the magnetic moment is generated by moving the ferrous object towards the system along a central axis of the primary coil assembly.

7. The superconducting magnet system according to claim 4, wherein the system is configured such that the magnetic moment is generated absent physical contact between the ferrous object and the EMI shielding coil assembly.

8. The superconducting magnet system according to claim 1, further comprising a ferrous object configured such that positioning the ferrous object in proximity to the EMI shielding coil assembly generates the magnetic flux within the EMI shielding coil assembly.

9. The superconducting magnet system according to claim 1, wherein the variable resistor is configured such that the third critical current is between 2.5 and 20 Amps.

10. The superconducting magnet system according to claim 1, wherein the variable resistor is a portion of a conductor within the EMI shielding coil assembly that has been treated such that the portion is superconducting subject to the third critical current and a remainder of the conductor is superconducting subject to the second critical current.

11. The superconducting magnet system according to claim 10, wherein the conductor forms at least one of the one or more coil sections.

12. A method for making a superconducting magnet system having two-stage quenching, the method comprising:
   providing a primary coil assembly having a coil section configured to be superconducting when conducting current below a first critical current; and
   providing an EMI shielding coil assembly having one or more coil sections configured to be superconducting when conducting current below a second critical current;
   electrically coupling a variable resistor to the EMI shielding coil assembly, wherein the variable resistor is configured to be superconducting when conducting current below a third critical current and to be non-superconducting when conducting current at or above the third critical current, the third critical current being less than both the first critical current and the second critical current;
   configuring the variable resistor such that generating a magnetic flux within the EMI shielding coil assembly causes the current conducted through the variable resistor to exceed the third critical current, quenching the variable resistor and generating heat; and
   disposing the EMI shielding coil assembly such that the heat from the variable resistor quenches the primary coil assembly.

13. The method according to claim 12, further comprising disposing the variable resistor so as to physically contact the primary coil assembly.

14. The method according to claim 12, further comprising coiling at least part of the variable resistor with the coil section of the primary coil assembly.

15. The method according to claim 12, further comprising configuring the EMI shielding coil assembly such that positioning a ferrous object with a magnetic moment in proximity to the EMI shielding coil assembly generates the magnetic flux within the EMI shielding coil assembly.

16. The method according to claim 12, further comprising configuring the system such that the primary coil assembly is quenched when an external device is positioned in proximity to the EMI shielding coil assembly absent physical contact therebetween.

17. The method according to claim 12, further comprising configuring the system such the primary coil assembly is quenched when an external device is positioned in proximity to the EMI shielding coil assembly absent a power supply powering the external device.

18. The method according to claim 12, further comprising configuring the EMI shielding coil assembly such that generating a magnetic field, via an external coil, generates the magnetic flux within the EMI shielding coil assembly.

19. The method according to claim 12, further comprising configuring the system such that the magnetic moment is generated by moving the ferrous object towards the system along a central axis of the primary coil assembly.

20. A superconducting magnet system having two-stage quenching, the superconducting magnet system comprising:
   a primary coil assembly having a coil section configured to be superconducting when conducting current below a first critical current;
   an EMI shielding coil assembly having one or more coil sections configured to be superconducting when conducting current below a second critical current;
   a variable resistor electrically coupled to the EMI shielding coil assembly and thermally coupled to the primary coil assembly, and the variable resistor being configured to be superconducting when conducting current below a third critical current and to be non-superconducting when conducting current at or above the third critical current that is less than both the first critical current and the second critical current;
   an external device configured to generate a magnetic flux within the EMI shielding coil assembly when positioned in proximity thereto, wherein generating the magnetic flux within the EMI shielding coil assembly causes the current conducted through the variable resistor to exceed the third critical current, quenching the variable resistor and generating heat; and
   wherein the EMI shielding coil assembly is disposed such that the heat generated by the variable resistor quenches the primary coil assembly.

* * * * *